US009786673B1

(12) United States Patent
Cho et al.

(10) Patent No.: US 9,786,673 B1
(45) Date of Patent: Oct. 10, 2017

(54) SEMICONDUCTOR MEMORY DEVICE INCLUDING PILLARS

(71) Applicant: SK hynix Inc., Gyeonggi-do (KR)

(72) Inventors: Jik Ho Cho, Gyeonggi-do (KR); Sun Chan Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/407,062

(22) Filed: Jan. 16, 2017

(30) Foreign Application Priority Data

Aug. 22, 2016 (KR) ........................ 10-2016-0106289

(51) Int. Cl.
*H01L 29/76* (2006.01)
*H01L 27/11565* (2017.01)
*H01L 27/11568* (2017.01)
*H01L 27/11582* (2017.01)
*H01L 23/528* (2006.01)
*H01L 29/10* (2006.01)

(52) U.S. Cl.
CPC ...... *H01L 27/11565* (2013.01); *H01L 23/528* (2013.01); *H01L 27/11568* (2013.01); *H01L 27/11582* (2013.01); *H01L 29/1033* (2013.01)

(58) Field of Classification Search
CPC ..................... H01L 27/11565; H01L 27/11568

USPC ........................................................ 257/314
See application file for complete search history.

(56) References Cited

U.S. PATENT DOCUMENTS

| 9,219,075 | B1 * | 12/2015 | Lai | ............... | H01L 27/11582 |
| 2014/0063890 | A1 * | 3/2014 | Lee | ............... | H01L 27/11519 |
| | | | | | 365/63 |
| 2014/0284607 | A1 * | 9/2014 | Fukuzumi | ......... | H01L 27/11582 |
| | | | | | 257/66 |
| 2016/0071870 | A1 * | 3/2016 | Minami | ............ | H01L 27/11582 |
| | | | | | 257/314 |

FOREIGN PATENT DOCUMENTS

| KR | 1020150022486 | 3/2015 |
| KR | 1020160029981 | 3/2016 |

* cited by examiner

*Primary Examiner* — David Vu
*Assistant Examiner* — Brandon Fox
(74) *Attorney, Agent, or Firm* — IP & T Group LLP (57) ABSTRACT

A semiconductor memory device may include: a first group of pillars having diameters which are gradually increased toward the a first side; and interlayer insulating layers and conductive patterns surrounding the pillars of the first group, the interlayer insulating layers and conductive patterns being alternately stacked.

20 Claims, 10 Drawing Sheets

SEMICONDUCTOR MEMORY DEVICE INCLUDING PILLARS

CROSS-REFERENCE TO RELATED APPLICATION

This U.S. non-provisional patent application claims priority under 35 U.S.C. §119(a) to Korean patent application number 10-2016-0106289 filed on Aug. 22, 2016 in the Korean Intellectual Property Office (KIPO), the disclosure of which is herein incorporated by reference in its entirety.

BACKGROUND

1. Field

Various embodiments of the present disclosure relate generally to a semiconductor memory device and, more particularly, to a semiconductor memory device including pillars passing through a stack.

2. Description of Related Art

Three-dimensional (3D) semiconductor memory devices including memory cells that are arranged in a three dimensional structure are well known in the art. A 3D semiconductor memory device may include a stack including alternating layers of insulating layers and conductive patterns, and vertical channel layers passing through the stack. As the disposition density of the channel layers is increased to improve the degree of integration, various defects may be caused during a manufacturing process of a 3D semiconductor memory device. Hence, improved 3D semiconductor memory devices and methods for making them are desirable.

SUMMARY

In an exemplary embodiment of the present disclosure, a semiconductor memory device may include: a first group of pillars having diameters which are gradually increased toward a first side; and interlayer insulating layers and conductive patterns surrounding the pillars of the first group, the interlayer insulating layers and conductive patterns being alternately stacked.

In an exemplary embodiment of the present disclosure, a semiconductor memory device may include: a stack including a first sidewall and a second sidewall that face each other in a first direction; an upper separation pattern disposed between the first sidewall and the second sidewall, and passing through at least portion of the stack from an upper surface of the stack; a first row of pillars passing through the stack and disposed adjacent to the first sidewall or the second sidewall; and an $n_{th}$ row of pillars (n is a natural number of 2 or more) passing through the stack and disposed adjacent to the upper separation pattern, each of the pillars of the $n_{th}$ row having a diameter greater than a diameter of each of the pillars of the first row.

In an exemplary embodiment of the present disclosure, a semiconductor memory device may include: a stack having a first sidewall and a second sidewall facing each other; and a plurality of pillars passing through the stack, wherein distances between the plurality of pillars are gradually reduced toward a center between the first sidewall and the second sidewall.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Hereinafter, embodiments will be described in greater detail with reference to the accompanying drawings. However, it is noted that the present invention may be embodied in different other forms and should not be construed as limited to the embodiments set forth herein. Rather, these embodiments are provided so that this disclosure will be thorough and complete, and will fully convey the present invention to those skilled in the art to which the present invention pertains.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Embodiments are described herein with reference to simplified schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

The phrase "at least one of . . . and . . . ," when used herein with a list of items, means a single item from the list or any combination of items in the list. For example, "at least one of A, B, and C" means, only A, or only B, or only C, or any combination of A, b, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure are directed to a 3D semiconductor memory device having an improved configuration so that defects during a manufacturing process may be reduced.

Figure 1:
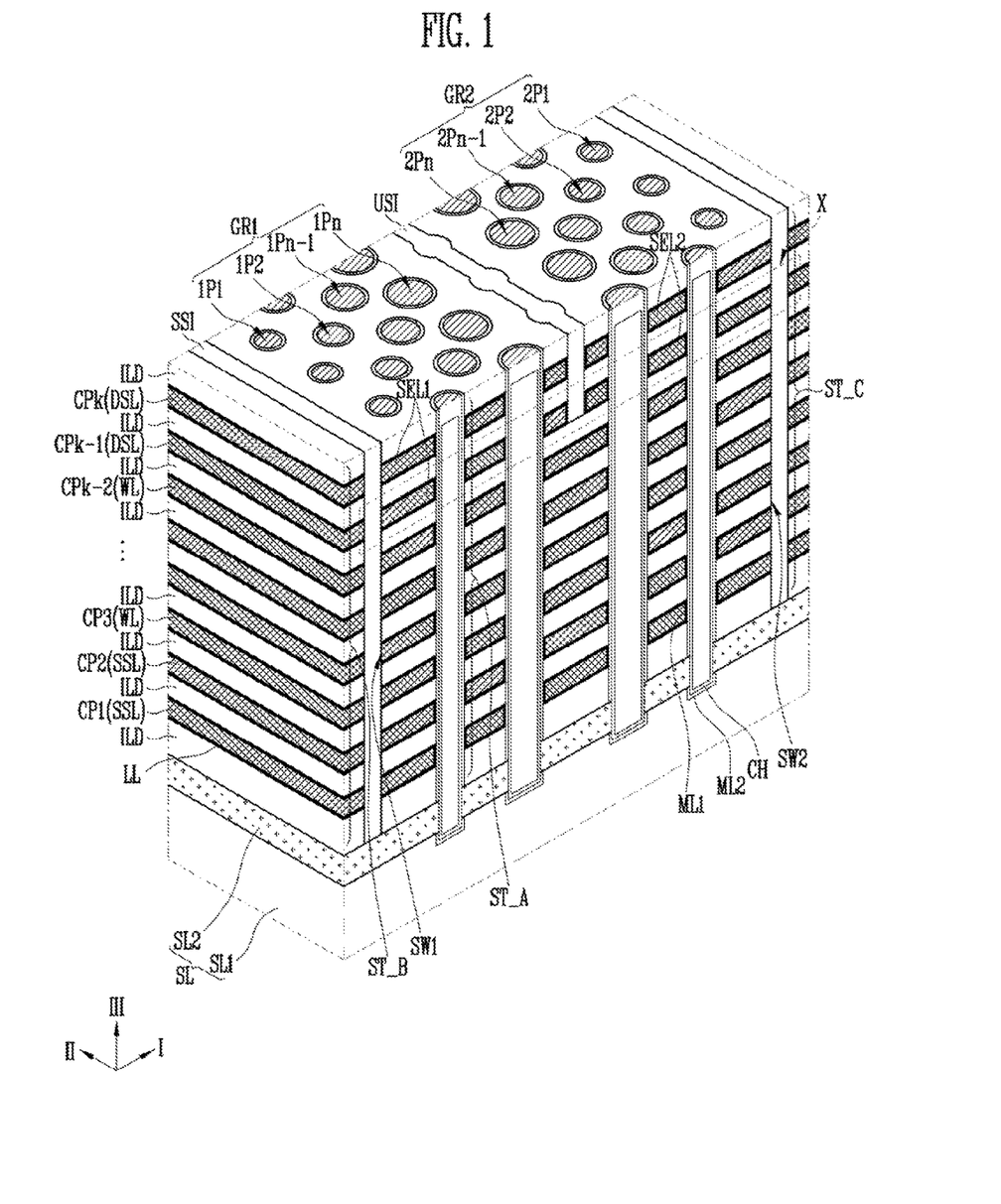
FIG. 1 is a perspective view illustrating a semiconductor memory device according to an exemplary embodiment of the present disclosure.

FIG. 1 is a perspective view illustrating a 3D semiconductor memory device according to an exemplary embodiment of the present disclosure. The semiconductor memory device may include a 3D nonvolatile memory cell array. In an embodiment, the 3D nonvolatile memory cell array may be a vertical NAND flash memory cell array.

Referring to FIG. 1, the semiconductor memory device may include stacks ST_A, ST_B and ST_C that are separated from each other by slit insulating layers SSI, pillars 1P1 to 1Pn and 2P1 to 2Pn that pass through each of the stacks ST_A, ST_B and ST_C, multilayer memory patterns ML1 and ML2 that surround each of the pillars 1P1 to 1Pn and 2P1 to 2Pn, and a source layer SL that encloses the bottoms of the pillars 1P1 to 1Pn and 2P1 to 2Pn.

The stacks ST_A, ST_B and ST_C may have the same structure. FIG. 1 illustrates only a portion of the semiconductor memory device. In particular, FIG. 1 is focused on the A-stack ST_A for the sake of explanation. Hereinafter, the structure of each of the stacks ST_A, ST_B and ST_C will be described centering on the A-stack ST_A. The A-stack ST_A may have a first sidewall SW1 and a second sidewall SW2 that are formed along sidewalls of the slit insulating layers SSI. The first and second sidewalls SW1 and SW2 extend vertically in a third direction III above the source layer SL and face each other in a first direction I. The A-stack ST_A may include a plurality of conductive patterns CP1 to CPk and interlayer insulating layers ILD that are alternately stacked.

The conductive patterns CP1 to CPk may be used as source select lines SSL, word lines WL and drain select lines DSL, in the recited order starting from the lowermost conductive pattern. In the embodiment of FIG. 1, there are two source select lines and two drain select lines DSL, however, their number may vary on design. Hence, the two lowermost conductive patterns CP1 and CP2 are employed as source select lines and the two uppermost conductive patterns CPk and CPk-1 are employed as drain select lines. The source select lines SSL are coupled to gates of source select transistors. The word lines WL are coupled to gates of memory cells and the drain select lines DSL are coupled to gate of a drain select transistors. The memory cells, the source select transistors and the drain select transistors are formed at the intersections of the corresponding conductive patterns and the pillars.

The conductive pattern CP1 disposed at a lowermost layer may be used as one of the source select lines SSL. Not only the conductive pattern CP1 disposed at the lowermost layer but also the conductive pattern CP2 disposed at a second layer over the lowermost layer may be used as the source select lines SSL. Although not shown, depending on design, some of the conductive patterns disposed over the conductive pattern CP2 disposed at the second layer may be used as the source select lines SSL.

The conductive pattern CPk disposed at an uppermost layer may be used as one of the drain select lines DSL. Not only the conductive pattern CPk disposed at the uppermost layer but also the conductive pattern CPk-1 disposed at a k-1$_{th}$ layer under the uppermost layer may be used as the drain select lines DSL. Although not shown, depending on design, some of the conductive patterns disposed under the conductive pattern CPk-1 disposed at the k-1$_{th}$ layer may be used as the drain select lines DSL. The conductive patterns (for example, CP3 to CPk-2) disposed between the drain select lines DSL and the source select lines SSL may be used as the word lines WL.

At least a portion of the A-stack ST_A may be penetrated by an upper separation pattern USI. For example, the upper separation pattern USI may thus separate each of the two uppermost conductive patterns (CPk-1 and CPk) into a first drain select line SEL1 and a second drain select line SEL2. The upper separation pattern USI may extend in the second direction II intersecting with the first direction I. Although, in the embodiment of FIG. 1, the upper separation pattern USI extends in the third direction III to a depth at an equal level with the bottom surface of the second from the top conductive pattern CPk-1, the invention is not limited in this way. For example, generally, the upper separation pattern USI may extend in the third direction III starting from the top surface of the A stack ST_A to the bottom surface of the lowermost conductive pattern that is used as a drain select line DSL. In another embodiment, (not shown), the upper separation pattern USI may extend in the third direction III to pass through the word lines WL and the source select line SSL that are disposed below the first drain select line SEL1 and the second drain select line SEL2. The third direction III refers to a direction which is perpendicular to a horizontal plane defined by the first and second directions I and II.

The upper separation pattern USI is disposed between the first sidewall SW1 and the second sidewall SW2. More particularly, the upper separation pattern USI is disposed between the first and second sidewalls SW1 and SW2 at substantially equal distances from each. The first drain select line SEL1 extends from the first sidewall SW1 toward the upper separation pattern USI, and the second drain select line SEL2 extends from the second sidewall SW2 toward the upper separation pattern USI. The first drain select line SEL1 and the second drain select line SEL2 that are disposed at the same level are spaced apart from each other by the upper separation pattern USI.

The word lines WL and the source select lines SSL are stacked below the first and second drain select lines SEL1 and SEL2. The word lines WL and the source select lines SSL may extend in the first direction I from the first sidewall SW1 to the second sidewall SW2.

The A-stack ST_A may further include liner layers LL that are formed along surfaces of the conductive patterns CP1 to CPk. More specifically, liner layers LL are formed along top and bottom surfaces of each of the conductive patterns CP1 to CPk. There are no liner layers LL formed on sidewalls of the conductive patterns CP1 to CPk toward the first sidewall SW1 and second sidewall SW2. Thus, the line layers LL are open toward the first sidewall SW1 and the second sidewall SW2. The liner layers LL extend between each of the sidewalls of the upper separation pattern USI and the conductive patterns CPk and CPk-1 The liner layers LL also extend on sidewalls of the pillars 1P1 to 1Pn and 2P1 to 2Pn, i.e., between the sidewalls of the pillars 1P1 to 1Pn and 2P1 to 2Pn and the conductive patterns CP1 to CPk.

The pillars 1P1 to 1Pn and 2P1 to 2Pn may be surrounded by the interlayer insulating layers ILD and the conductive patterns CP1 to CPk. The pillars 1P1 to 1Pn and 2P1 to 2Pn may be classified into a first and a second group of pillars GR1 and GR2.

The first group of pillars GR1 may be disposed between the first sidewall SW1 and the upper separation pattern USI. The first group of pillars GR1 may include a first row of pillars 1P1 to an n$_{th}$ row of pillars (1Pn; n is a natural number of 2 or more). The pillars of the first group GR1 may be surrounded by the first drain select line SEL1. Multiple rows of pillars 1P2 to 1Pn-1 may be disposed in a zigzag manner between the first row of pillars 1P1 and the n$_{th}$ row of pillars 1Pn.

The pillars of the second group GR2 may be disposed between the second sidewall SW2 and the upper separation pattern USI. The pillars of the second group GR2 may include a first row of pillars 2P1 to an n$_{th}$ row of pillars 2Pn. The pillars of the second group GR2 may be surrounded by the second drain select line SEL2. Multiple rows of pillars 2P2 to 2Pn-1 may be disposed in a zigzag manner between the first row of pillars 2P1 and the n$_{th}$ row of pillars 2Pn.

The pillars of the first group GR1 may be arranged to be symmetrical with the pillars of the second group GR2 based on the upper separation pattern USI. Each of the word lines WL may extend to surround the pillars of the first group GR1 and the pillars of the second group GR2.

Each of the pillars 1Pn or 2Pn arranged in the no row which is adjacent to the upper separation pattern USI may have a diameter that is larger than that of each of the pillars 1P1 arranged in the first row adjacent to the first sidewall SW1 or each of the pillars 2P1 arranged in the first row adjacent to the second sidewall SW2. Moreover, the pillars of the first group GR1 and the pillars of the second group GR2 may gradually increase in diameter as they are close to the upper separation pattern USI. In other words, the pillars of the first group GR1 may have diameters which are gradually increased toward a first side and the pillars of the second group GR2 may have diameters which are gradually increased toward a second side. The first side and the second sides are opposite.

The multilayer source layer SL may include a first source layer SL1 and a second source layer SL2. The second source layer SL2 may be stacked on the first source layer SL1. The multilayer source layer SL may be disposed under the stacks ST_A, ST_B and ST_C. The slit insulating layers SSI may extend onto an upper surface of the second source layer SL2. The first source layer SL1 and the second source layer SL2 may be formed of various conductive materials. For example, the first source layer SL1 may include at least one of a low-resistance metal layer and a silicon layer, and the second source layer SL2 may include a silicon layer.

Each of the multilayer memory patterns ML1 and ML2 may include a tunnel insulating layer, a data storage layer and a first blocking insulating layer. The multilayer memory patterns ML1 and ML2 may be divided into a first multilayer memory pattern ML1 and a second multilayer memory pattern ML2. The first multilayer memory pattern ML1 may extend along an interface between each of the pillars 1P1 to 1Pn and 2P1 to 2Pn and the A-stack ST_A. The pillars 1P1 to 1Pn and 2P1 to 2Pn may extend into the first source layer SL1. The second multilayer memory pattern ML2 may extend along an interface between the first source layer SL1 and each of the pillars 1P1 to 1Pn and 2P1 to 2Pn. The second source layer SL2 extends between the first multilayer memory pattern ML1 and the second multilayer memory pattern ML2, and comes into contact with sidewalls of respective channel layers CH of the pillars 1P1 to 1Pn and 2P1 to 2Pn.

Although not illustrated in detail, the structure of the A-stack ST_A may be the same as that of the other stacks ST_B and ST_C.

Although not shown, an upper surface of the channel layer CH of each of the pillars 1P1 to 1Pn and 2P1 to 2Pn may be coupled to a bit line. A memory string may be formed along the channel layer CH disposed between the bit line and the multilayer source layer SL. The memory string may include drain select transistors coupled to the drain select lines DSL, source select transistors coupled to the source select lines SSL and the memory cells coupled to the word lines WL.

Figure 2A:
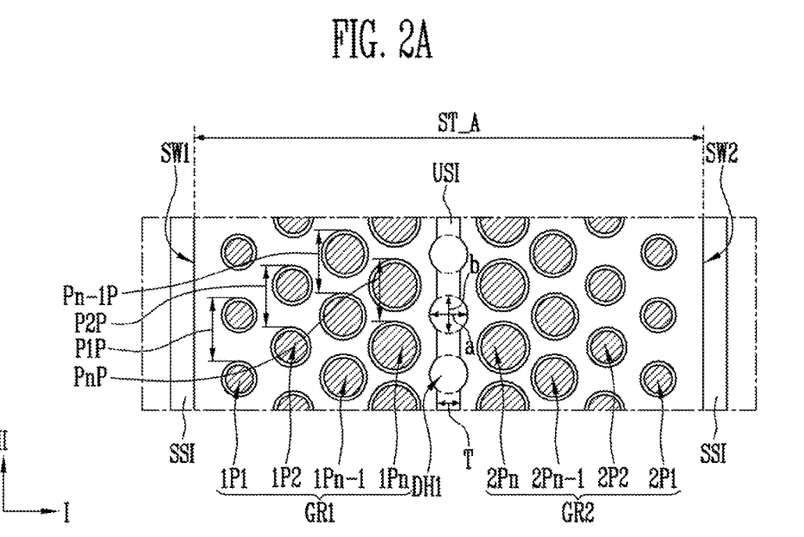
FIGS. 2A and 2B are plan views illustrating semiconductor memory devices according to exemplary embodiments of the present disclosure.
Figure 2B:
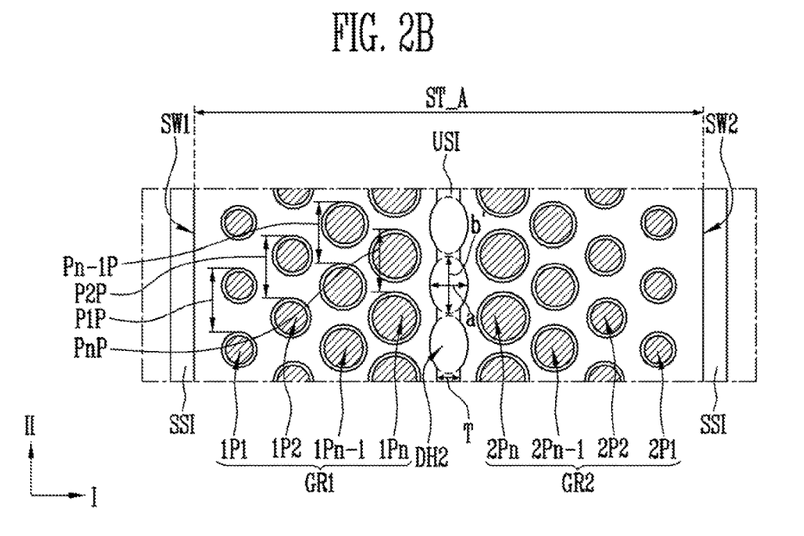

FIGS. 2A and 2B are plan views illustrating semiconductor memory devices according to exemplary embodiments of the present disclosure. For the sake of explanation, FIGS. 2A and 2B are focused on the A-stack ST_A.

Referring to FIGS. 2A and 2B, the A-stack ST_A is penetrated by the pillars of the first group GR1 and the pillars of the second group GR2, as illustrated in FIG. 1. At least a portion of the A-stack ST_A is penetrated by the upper separation pattern USI, as illustrated in FIG. 1. As illustrated in FIG. 1, the A-stack ST_A may have the first sidewall SW1 and the second sidewall SW2 that are formed along sidewalls of the slit insulating layers SSI.

The arrangement and diameters of the pillars in the first to $n_{th}$ rows 1P1 to 1Pn that form the first group of pillars GR1, and the arrangement and diameters of the pillars in the first to $n_{th}$ rows 2P1 to 2Pn that form the second group of pillars GR2 are the same as those described with reference of FIG. 1.

A trench T and dummy holes DH1 or DH2 may be filled with the upper separation pattern USI. The trench T extends in the second direction II. The dummy holes DH1 or DH2 are arranged to be spaced apart from each other in the second direction II, and are overlapped with the trench T. The depth of the trench T is the same as that of the upper separation pattern USI illustrated in FIG. 1. The dummy holes DH1 or DH2 may include an upper portion that is filled with the upper separation pattern USI, and a lower portion that is filled with dummy patterns (not shown). Although not shown, the lower portion of each of the dummy holes DH1 or DH2 and each of the dummy patterns may extend to pass through the A-stack ST_A from a lower surface of the upper separation pattern USI. That is, the dummy holes DH1 or DH2 may be formed to a depth greater than that of the upper separation pattern USI and the trench T. The dummy holes DH1 or DH2 may have various planar structures.

For example, as shown in FIG. 2A, each of the dummy holes DH1 may be formed in a circular shape in which an a-axis and a b-axis crossing each other have the same length. Alternatively, as shown in FIG. 2B, each of the dummy holes DH2 may be formed in an elliptical shape in which an a-axis and a b'-axis crossing each other have different lengths. Each of the dummy holes DH2 has an elliptical shape formed such that the length of the b'-axis extending in a second direction (II; a direction in which the trench T extends) is longer than that of the a-axis extending in a first direction I intersecting with the second direction II. In the case where each of the dummy holes DH2 is formed in an elliptical shape, an operation of forming the dummy holes DH2 such that the distance between the dummy holes DH2 is less than the distance between the pillars of the $n_{th}$ row 1Pn or 2Pn adjacent thereto can be facilitated.

The dummy holes DH1, DH2 may be spaced apart from the pillars of the first group GR1 and the pillars of the second group GR2 by distances less than the distances between the pillars of the first group GR1 and the distances between the pillars of the second group GR2.

In an exemplary embodiment of the present inventive concept, a plurality of pillars 1P1, 1P2, 1Pn-1, and 1Pn may include a plurality of first pillars 1P1 arranged in a first row adjacent to the first sidewall SW1 and arranged at a first pitch P1P, a plurality of second pillars 1P2 arranged in a second row and arranged at a second pitch P2P, a plurality of n-1$_{th}$ pillars 1Pn-1 arranged in a n-1$_{th}$ row and arranged at a n-1$_{th}$ pitch Pn-1P, and a plurality of n$_{th}$ pillars 1Pn arranged in a n$_{th}$ row adjacent to the center between the first sidewall and the second sidewall and arranged at a nm pitch PnP. The second row may be disposed between the first row and the n$_{th}$ row. The n-1$_{th}$ row may be disposed between the second row and the n$_{th}$ row. The first pitch P1P, the second pitch P2P, the n-1$_{th}$ pitch Pn-1P, and the n$_{th}$ pitch may be substantially the same.

Figure 3:
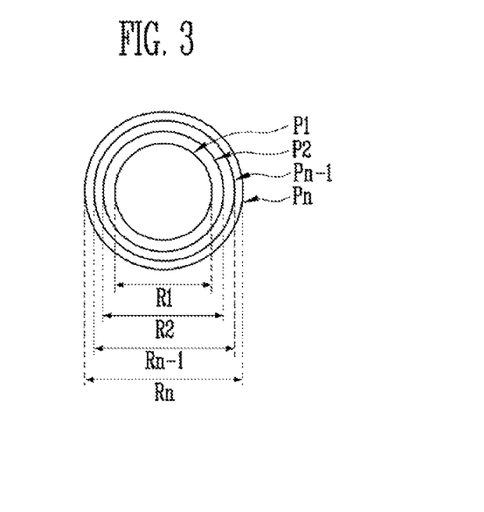
FIG. 3 is a plan view comparing diameters of pillars of a semiconductor memory device according to an exemplary embodiment of the present disclosure.

FIG. 3 is a plan view comparing the diameters of pillars of a semiconductor memory device according to an exemplary embodiment of the present disclosure.

The first row of pillars 1P1 or 2P1 shown in FIGS. 1, 2A and 2B includes a plurality of first pillars P1 arranged in a row along the second direction II. The second row of pillars 1P2 or 2P2 shown in FIGS. 1, 2A and 2B includes a plurality of second pillars P2 arranged in a row along the second direction II. The n-1$_{th}$ row of pillars 1Pn-1 or 2Pn-1 shown in FIGS. 1, 2A and 2B includes a plurality of n-1$_{th}$ pillars Pn-1 arranged in a row along the second direction II. The n$_{th}$ row of pillars 1Pn or 2Pn includes a plurality of n$_{th}$ pillars Pn arranged in a row along the second direction II.

The diameter of the first pillar P1 is defined as 'R1', the diameter of the second pillar P2 is defined as 'R2', the diameter of the n-1$_{th}$ pillar Pn-1 is defined as 'Rn-1' and the diameter of the n$_{th}$ pillar Pn is defined as 'Rn' In this case, the size relationship between the diameters of the first to n$_{th}$ pillar P1 to Pn may be defined as R1<R2<Rn-1<Rn.

As described with reference to FIGS. 1 to 3, the diameter of the pillars passing through the stack may vary. This may be advantageous, because it allows controlling of the flow velocity of gases that are drawn to form the conductive patterns during a manufacturing of the semiconductor memory device and reduces the possibility of process failure. Detailed explanation thereof will be described later herein with reference to FIGS. 5D, 6, 7, 8A and 8B.

Figure 4:
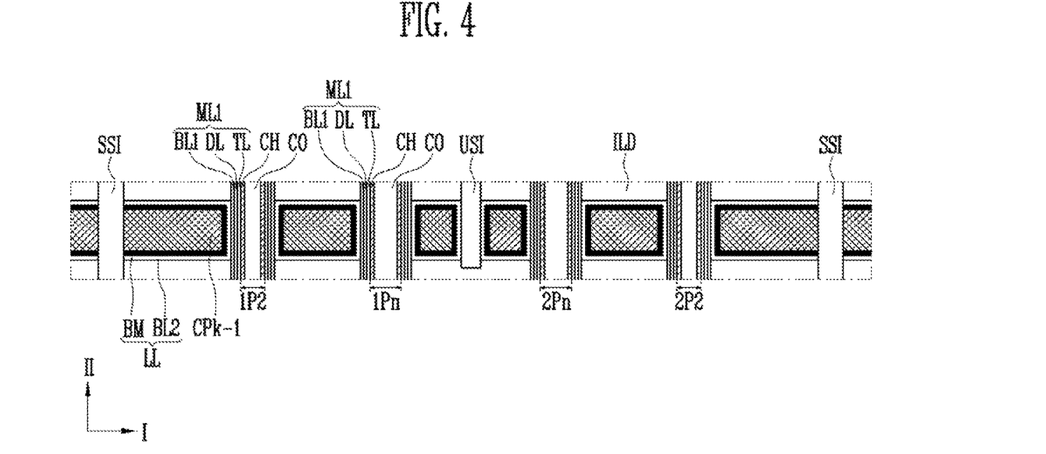
FIG. 4 is an enlarged sectional view of region X shown in FIG. 1.

FIG. 4 is an enlarged sectional view of region X of FIG. 1.

Referring to FIG. 4, each of the pillars, for example, 1P2, 1Pn, 2Pn and 2P2, may include a channel layer CH. The channel layer CH may have a tubular cross-section surrounding a core insulating layer CO filling the space within the channel layer CH, as illustrated in the embodiment of FIG. 4. Hence, in the illustrated embodiment, each of the pillars 1P2, 1Pn, 2Pn and 2P2 includes a tubular channel layer CH forming the outer surface of each of the pillars 1P2, 1Pn, 2Pn and 2P2, and a core insulating layer CO filling the inside space of the tubular channel layer CH. States otherwise, the core insulating layer CO may fill the central region of each of the pillars 1P2, 1Pn, 2Pn and 2P2, and be surrounded by the channel layer CH. In an alternative embodiment, the channel layer CH may be a rod filling the entire space from the surface of each pillar 1P2, 1Pn, 2Pn, 2P2 to the central region thereof.

A first multilayer memory pattern ML1 may surround each of the pillars 1P2, 1Pn, 2Pn and 2P2. More specifically, the first multilayer memory pattern ML1 may include a tunnel insulating layer TL that surrounds the channel layer CH, a data storage layer DL that surrounds the tunnel insulating layer TL, and a first blocking insulating layer BL1 that surrounds the data storage layer DL. The tunnel insulating layer TL may be formed of a silicon oxide layer making charge tunneling possible. The data storage layer DL may be formed of a silicon nitride layer capable of trapping charges. The first blocking insulating layer BL1 may be formed of a silicon oxide layer capable of blocking charges.

Each of the liner layers LL that surround the conductive patterns (for example, CPk−1) may include a barrier metal layer BM. The barrier metal layer BM may be or include a material layer such as a titanium nitride layer capable of preventing metal diffusion.

Each of the liner layers LL may further include a second blocking insulating layer BL2. The second blocking insulating layer BL2 may not be formed in some cases. To prevent a back tunneling phenomenon, the second blocking insulating layer BL2 may be formed of a material layer having a work function larger than that of the first blocking insulating layer BL1. For example, the second blocking insulating layer BL2 may be formed of an aluminum oxide layer.

Each of the liner layers LL may have an opening pattern toward a slit insulating layer SSI. In detail, the barrier metal layer BM may have a pattern in which it is open toward the slit insulating layer SSI. The barrier metal layer BM may be formed on the surfaces of the interlayer insulating layers ILD, the sidewalls of the pillars 1P2, 1Pn, 2Pn and 2P2, and the sidewall of the upper separation pattern USI, before the slit insulating layer SSI is formed. Detailed explanation of this will be described later herein with reference to FIG. 5D.

FIGS. 5A to 5D are sectional views illustrating a method of manufacturing a semiconductor memory device, according to an exemplary embodiment of the present disclosure.

Figure 5A:
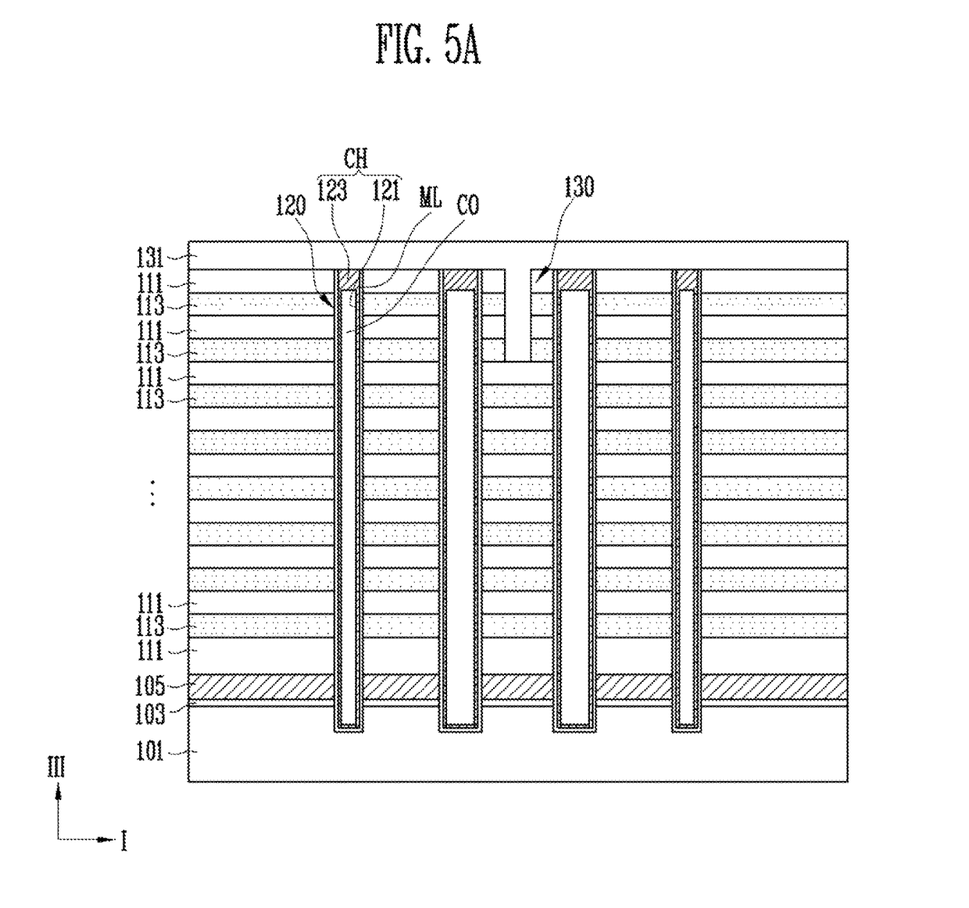
FIGS. 5A to 5D are sectional views illustrating a method of manufacturing a semiconductor memory device according to an exemplary embodiment of the present disclosure.

Referring to FIG. 5A, a first stack is formed by successively stacking a first source layer 101, a protective layer 103 and a source sacrificial layer 105. The first source layer 101 may be made of conductive material. The first source layer 101 may be made of conductive material which may be used as a growth seed layer of the second source layer during a following process. For example, the first source layer 101 may be made of silicon. The first source layer 101 may be made of a multilayer formed by stacking a metal layer and a silicon layer to reduce the resistance of a source line. The silicon layer may be formed on the metal layer. The metal layer may be or include a material having a resistance that is lower than that of the silicon layer. For example, the metal layer may be tungsten.

The protective layer 103 may be made of material different from that of the source sacrificial layer 105 such that the source sacrificial layer 105 can be selectively removed during a following process. The source sacrificial layer 105 may be made of material that may be selectively removed during a following process. For example, the protective layer 103 may comprise an oxide layer and the source sacrificial layer 105 may be made of polysilicon.

Subsequently, a second stack may be formed by alternately stacking first material layers 111 and second material layers 113 on the first stack.

The first material layers 111 and the second material layers 113 may be made of different materials. The first material layers 111 may be formed of an insulating material suitable for an interlayer insulating layer, whereas the second material layers 113 may be formed of an insulating material suitable for a sacrificial layer having an etching rate different from that of the first material layers 111. For example, the first material layers 111 may be formed of silicon oxide layers, and the second material layers 113 may be formed of silicon nitride layers.

Subsequently, vertical holes 120 may be formed to pass through the first and second material layers 111 and 113 by etching the first and second material layers 111 and 113. To form the vertical holes 120, the source sacrificial layer 105 and the protective layer 103 may be further etched. Here, only an upper portion of the first source layer 101 may be etched. In this case, the vertical holes 120 may pass through the source sacrificial layer 105 and the protective layer 103, and extend into the first source layer 101. The vertical holes 120 may have diameters which are designed to correspond to the diameters of the pillars 1P1 to 1Pn, 2P1 to 2Pn and the thickness of the first multilayer memory pattern ML1 that are described with reference to FIGS. 1, 2A to 2B. In addition, the vertical holes 120 have the same horizontal arrangement as that of the pillars 1P1 to 1Pn, 2P1 to 2Pn described with reference to FIGS. 1, 2A to 2B. While the vertical holes 120 are formed, the dummy holes DH1 described with reference to FIG. 2A or the dummy holes DH2 described with reference to FIG. 2B may also be formed. In this case, the stability of a photolithography process for forming the vertical holes 120 may be enhanced.

Subsequently, a channel layer CH that is surrounded by a multilayer memory layer ML may be formed in each of the vertical holes 120. The channel layer surrounded by the multilayer memory layer ML may be formed by successively performing the following processes.

First, the multilayer memory layer ML may be formed on the surface of each of the vertical holes 120. The multilayer memory layer ML may be formed by successively stacking the first blocking insulating layer BL1, the data storage layer DL and the tunnel insulating layer TL that are described above with reference to FIG. 4 and etching a portion of each of the first blocking insulating layer BL1, the data storage layer DL and the tunnel insulating layer TL on a top surface of the second stack.

Subsequently, a first semiconductor layer 121 may be formed on the multilayer memory layer ML. The first semiconductor layer 121 may be formed such that each vertical hole 120 is completely filled therewith, or be formed in a tubular shape in which a central region of the vertical hole 120 is open. In the case where the first semiconductor layer 121 is formed in a tubular shape, the central region of each of the vertical holes 120 may be filled with a core insulating layer CO.

An upper end of the core insulation layer CO may be etched. In this case, the core insulating layer CO may be formed such that the height thereof is less than that of the first semiconductor layer 121. A region from which the core insulating layer CO has been removed may be filled with a second semiconductor layer 123. The second semiconductor layer 123 may include a doped silicon layer. In this way, the channel layer CH that includes the first semiconductor layer 121 and the second semiconductor layer 123 may be formed.

The channel layer CH and the multilayer memory layer ML may be planarized until an upper surface of the second stack that includes the first material layers 111 and the second material layers 113 is exposed. In this way, the channel layer CH and the multilayer memory layer ML may remain only in each of the vertical holes 120.

The above-described channel layer CH and multilayer memory layer ML may remain as a dummy pattern in each of the dummy holes DH1 or DH2 described with reference to FIG. 2A or 2B.

Subsequently, the first material layers 111 and the second material layers 113 may be etched to form a trench 130 that passes through at least a portion of the first material layers 111 and the second material layers 113. The trench 130 has the same structure as that of the trench T described with reference to FIG. 2A or 2B. Portions of the channel layer and multilayer memory layer that remain as the dummy pattern (not shown) in each of the dummy holes (refer to DH1 of FIG. 2A or DH2 of FIG. 2B) in the preceding process may be removed during the process of forming the trench 130. Thereby, the upper end of each of the dummy holes may open.

Thereafter, the insulating layer may be formed such that the trench 130 and the dummy holes are filled therewith. Thereby, an upper separation pattern 131 may be formed. The upper separation pattern 131 may be planarized to expose the upper surface of the second stack that includes the first material layers 111 and the second material layers 113, or extend on the upper surface of the second stack.

Figure 5B:
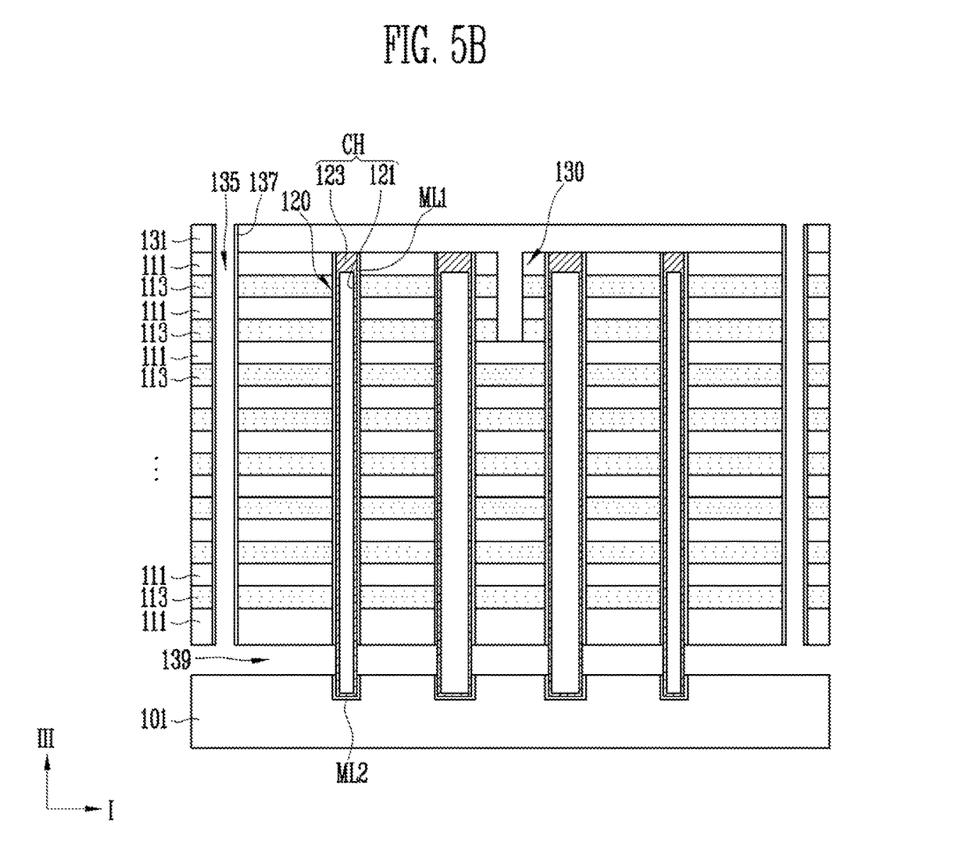

Referring to FIG. 5B, slits 135 may be formed to pass through the upper separation pattern 131, the first material layers 111 and the second material layers 113 by etching portions of the upper separation pattern 131, the first and second material layers 111 and 113. Thereafter, a sidewall insulating layer 137 may be formed on a sidewall of each of the slits 135. The sidewall insulating layer 137 may be made of material different from that of the source sacrificial layer 105 described with reference to FIG. 5A.

Subsequently, a first interlayer region 139 that exposes the channel layer CH is formed as follows. First, the source sacrificial layer 105 may be selectively removed. While the source sacrificial layer 105 is removed, the protective layer 103 described with reference to FIG. 5A may protect the first source layer 101, and the sidewall insulating layer 137 may protect the first materials 111 and the second materials 113 Thereafter, a portion of the multilayer memory layer that is exposed by removing the source sacrificial layer 105 may be removed so that the multilayer memory layer may be divided into the first multilayer memory pattern ML1 and the second multilayer memory pattern ML2. Thereby, the first interlayer region 139 that exposes the channel layer CH opens between the first source layer 101 and the second stack. While the multilayer memory layer is etched, the protective layer 103 may be removed. Alternatively, the protective layer 103 may be removed through a separate etching process. The sidewall insulating layer 137 may be removed while the multilayer memory layer is etched. Alternatively, the sidewall insulating layer 137 may be removed through a separate etching process.

Figure 5C:
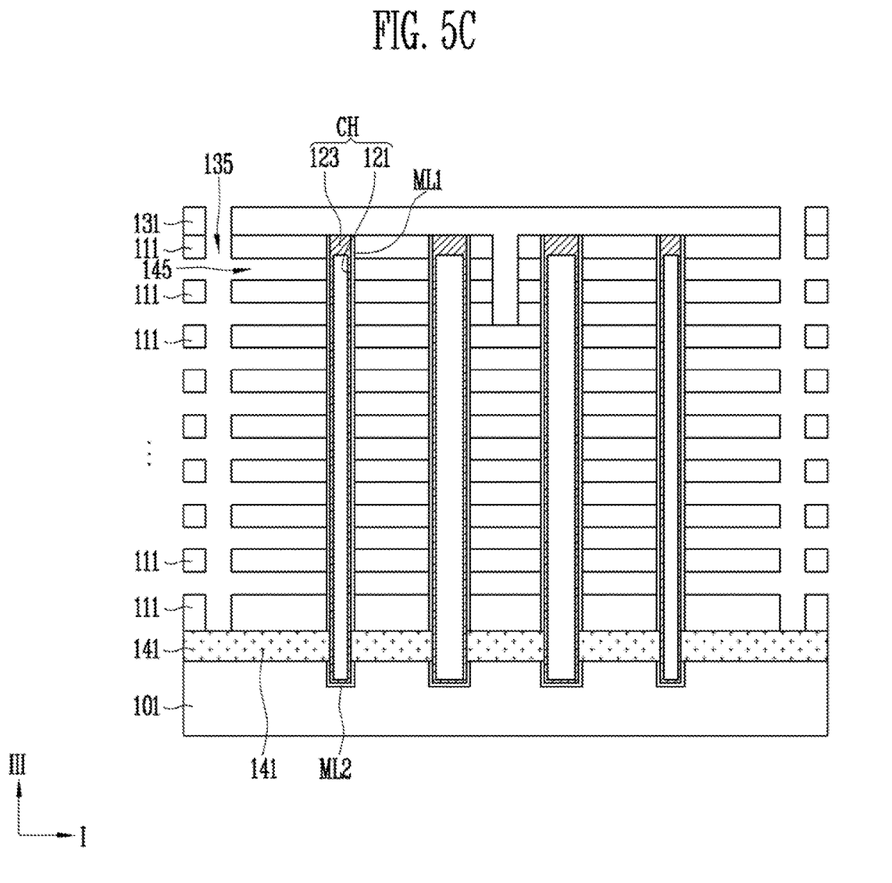

Referring to FIG. 5C, a second source layer 141 may be formed to fill the first interlayer region 139 and come into contact with the sidewall of the channel layer CH and an upper surface of the first source layer 101. In an embodiment, the second source layer 141 may be formed by depositing conductive material to fill the first interlayer region 139. In another embodiment, the second source layer 141 may be formed by growing the silicon layer from the channel layer CH and the first source layer 101.

When the sidewall insulating layer 137 described with reference to FIG. 5B is removed, the second material layers 113 of the second stack shown in FIG. 5B are exposed through the slits 135 and may then be removed by a selective etching process. Thereby, as shown in FIG. 5C, second interlayer regions 145 are opened between the first material layers 111.

Figure 5D:
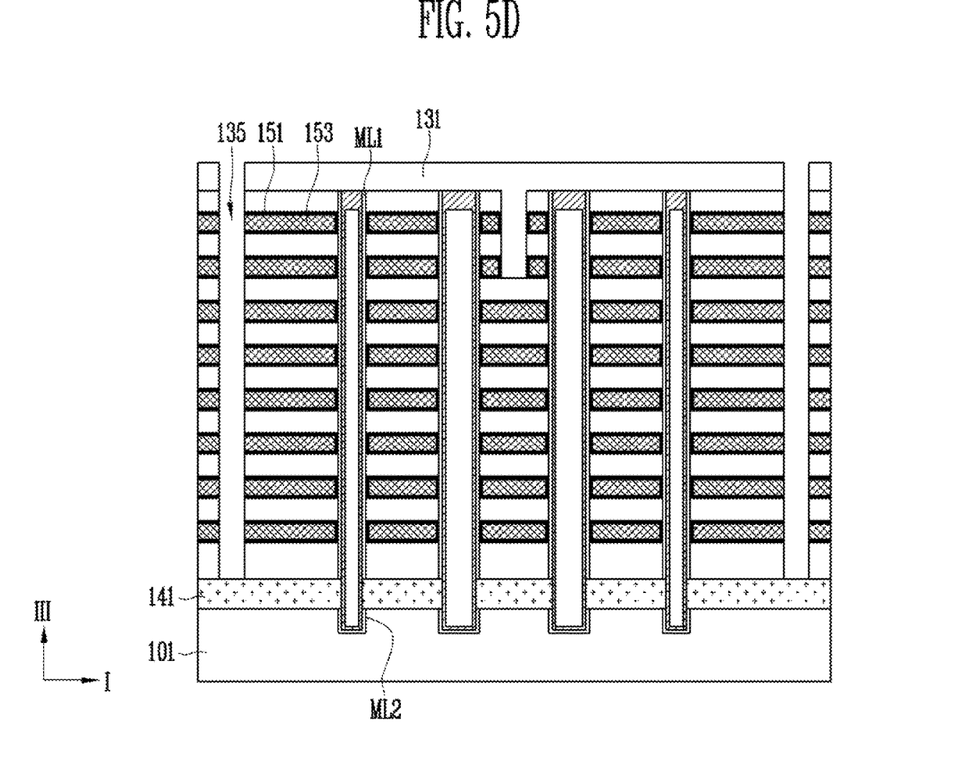

Referring to FIG. 5D, a thin layer may be formed on a surface of each of the second interlayer regions (145 of FIG. 5C). The thin layer extends onto the surface of the first multilayer memory pattern ML1 and the sidewall of the upper separation pattern 131. The thin layer includes material layers for liner layers 151. The thin layer may be drawn onto the surface of the second interlayer regions 145, the surface of the first multilayer memory pattern ML1 and the sidewall of the upper separation pattern 131, through the slits 135. The thin layer may also be formed on the sidewall of each of the slits 135. Subsequently, portions of the thin layer that are formed in the slits 135 may be removed so that the liner layers 151 are separated from each other in a shape shown in FIG. 5D. Each of the liner layers 151 may include the barrier metal layer BM and the second blocking insulating layer BL2, as described with reference to FIG. 4. Each of the liner layers 151 has a pattern in which it opens toward the corresponding slit 135.

Subsequently, conductive patterns 153 with which the second interlayer regions 145 may be filled are formed on the liner layers 151. Deposition gas and purge gas may be drawn through the slits 135 to form the conductive patterns 153. The deposition gas and the purge gas that are drawn through the slits 135 flow toward the upper separation pattern 131 and the dummy patterns with which the dummy holes (DH1 of FIG. 2A or DH2 of FIG. 2B) are filled.

For example, in the case where the conductive patterns 153 are to be made of tungsten which is a low-resistance metal, tungsten hexafluoride ($WF_6$) gas and hydrogen gas may be drawn as deposition gas. Here, not only may the tungsten be deposited, but an impurity such as hydrogen fluoride gas may also be generated. The purge gas may be an inactive gas and may be drawn to remove any impurity.

In an exemplary embodiment of the present disclosure, as illustrated in FIGS. 1 to 3, the diameters of the pillars may vary and may be adjusted by design, whereby a reduction in the velocity of the deposition gas and the purge gas may be mitigated. It has been observed, that such a structure reduces the impurity concentration that remains during the process of forming the conductive patterns 153. Therefore, in the exemplary embodiment of the present disclosure, the possibility of process failure that may be caused by an excessive concentration of remaining impurity may be reduced. In addition, according to the exemplary embodiment of the present disclosure, the central portion of each of the second interlayer regions 145 close to the upper separation pattern 131 and the dummy holes (DH1 of FIG. 2A or DH2 of FIG. 2B) may be more easily filled with the conductive patterns 153.

Figure 6:
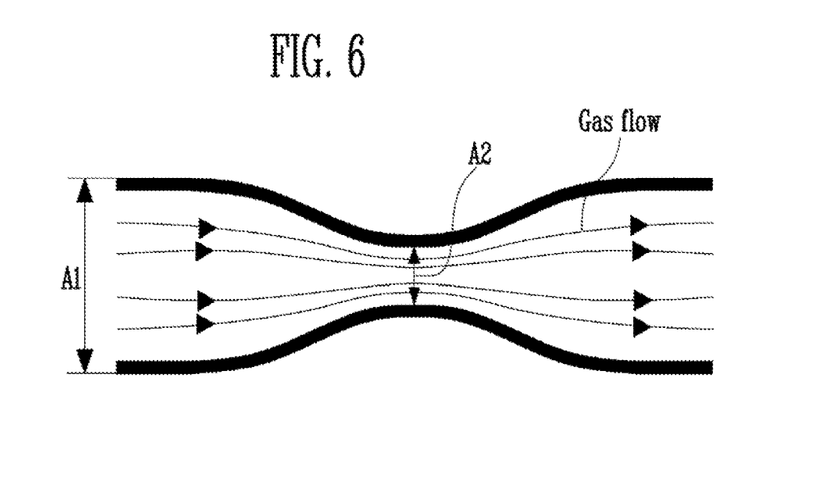
FIG. 6 is a view illustrating variation in gas velocity.

FIG. 6 is a view illustrating variation in gas velocity.

In the case where a layer is deposited on the substrate using a chemical vapor deposition (CVD) method, an atomic layer deposition (ALD) method, etc., a diffusion boundary layer is formed by the viscous force of the substrate. The velocity of gas that is drawn for the deposition at a predetermined flow rate may be reduced by the viscous force of a deposition target (for example, the substrate). The diffusion boundary layer is a region in which the gas velocity is reduced. As the thickness of the diffusion boundary layer is increased, the concentration of the remaining impurity is increased. Therefore, present disclosure proposes a structure and a method by which the region in which the velocity of deposition gas and purge gas is reduced is minimized to reduce the thickness of the diffusion boundary layer.

Referring to FIG. 6, gas flowing along a flow path which varies in a sectional area thereof may be drawn at a predetermined flow rate into an inlet hole having a first sectional area A1. Thereafter, gas may pass through a region having a second sectional area A2 less than the first sectional area A1. According to Bernoulli's principle, when gas passes through the region having the second sectional area A2 after passing through the region having the first sectional area A1, the velocity of the gas is increased and the pressure is reduced. In an exemplary embodiment of the present disclosure referring to this phenomenon, the arrangement of the pillars of the semiconductor memory device is controlled such that the region in which the velocity of deposition gas and purge gas that are drawn to deposit the conductive patterns is reduced is minimized.

Figure 7:
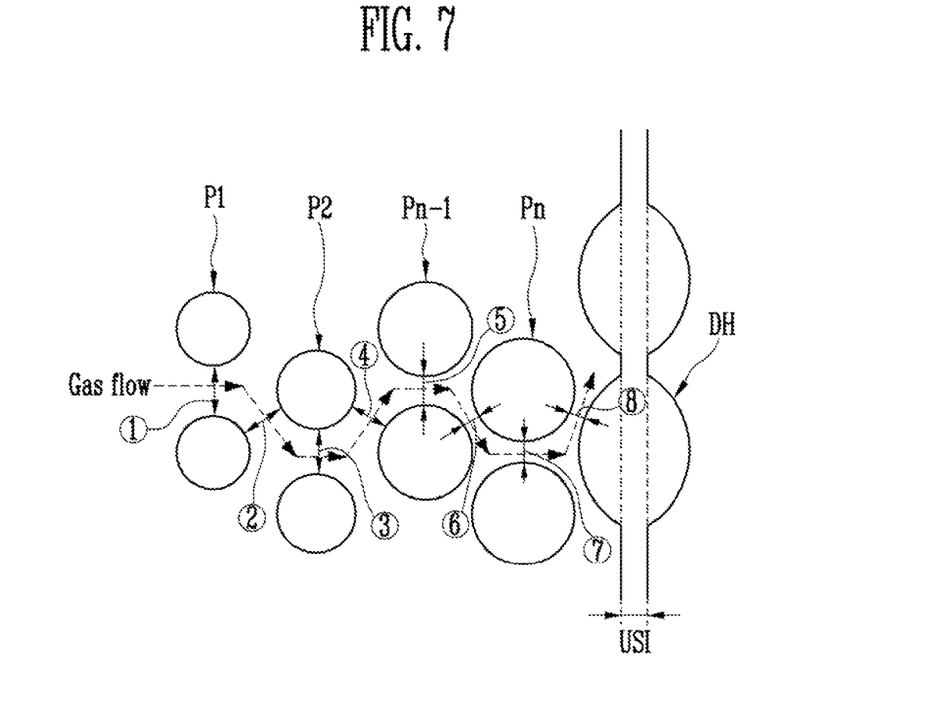
FIG. 7 is a plan view illustrating the distances between the pillars of the semiconductor memory device according to an exemplary embodiment of the disclosure.

FIG. 7 is a plan view illustrating the distances between the pillars of the semiconductor memory device according to an exemplary embodiment of the disclosure.

Referring to FIG. 7, as described with reference to FIG. 3, an exemplary embodiment of the present disclosure may include a first group of pillars or a second group of pillars that includes a first pillar P1 to an $n_{th}$ pillar Pn. According to the exemplary embodiment of the present disclosure, the diameters of the pillars P1 to Pn may be controlled such that the diameter of the $n_{th}$ pillar Pn adjacent to the upper separation pattern USI and the dummy hole DH is larger than that of the first pillar P1 adjacent to the inlet hole for deposition gas and purge gas. In this case, the distance ⑦ between the pillars of the $n_{th}$ row that includes a plurality of $n_{th}$ pillars Pn may be controlled to be less than the distance ① between the pillars of the first row that includes a plurality of first pillars P1. Thereby, the exemplary embodiment of the present disclosure may mitigate a reduction in velocity of the deposition gas and purge gas that flow from a space between the first pillars P1 spaced apart from each other by the distance ① and pass through a space between the $n_{th}$ pillars spaced apart from each other by the distance ⑦.

Moreover, in the exemplary embodiment of the present disclosure, the diameters of the pillars P1 to Pn may be controlled such that they are gradually increased from the inlet hole for the deposition gas and purge gas toward the upper separation pattern USI and the dummy hole DH. In this case, the distances ① to ⑦ of the pillars P1 to Pn may be controlled to be gradually reduced toward the upper separation pattern USI and the dummy hole DH. Thereby, the exemplary embodiment of the present disclosure may mitigate a reduction in velocity of the deposition gas and purge gas that flow from the inlet hole toward the upper separation pattern USI and the dummy hole DH.

In the exemplary embodiment of the present disclosure, the distance ⑧ between each $n_{th}$ pillar Pn and the dummy hole DH adjacent thereto may be controlled to be less than the distance ⑦ between the plurality of the $n_{th}$ pillars Pn.

The inlet hole for the deposition gas and the purge gas is adjacent to the slit 135 described with reference to FIG. 5D. The dummy hole DH may be formed in a circular shape, as described with reference to FIG. 2A, or in an elliptical shape, as described with reference to FIG. 2B.

Figure 8A:
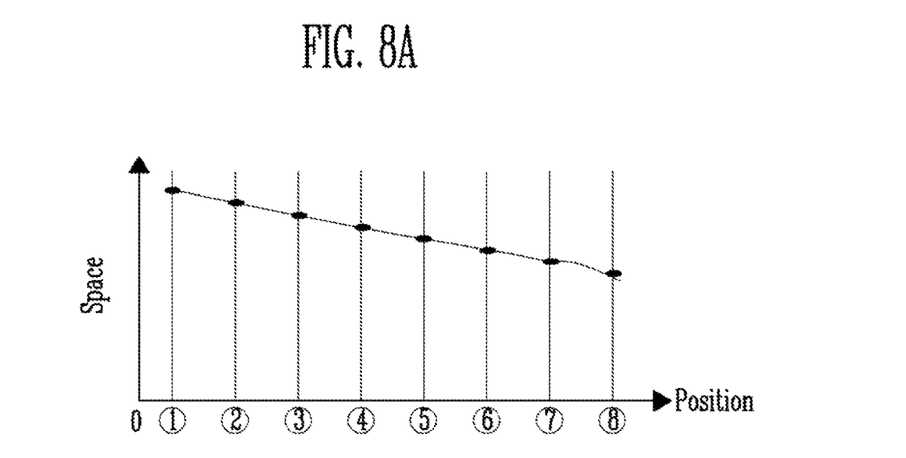
FIGS. 8A and 8B are graphs illustrating distances between pillars of a semiconductor memory device and the velocity of gas flowing between the pillars according to an exemplary embodiment of the present disclosure.
Figure 8B:
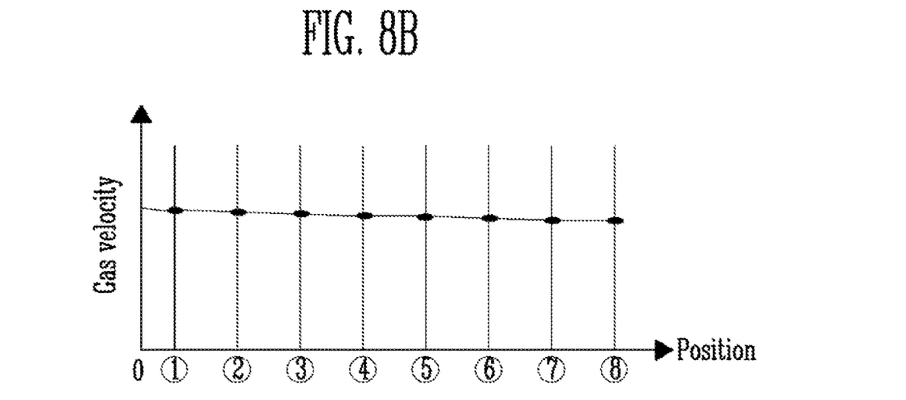

FIGS. 8A and 8B are graphs illustrating the distances between the pillars of the semiconductor memory device and the velocity of gas flowing between the pillars according to an exemplary embodiment of the present disclosure.

As described with reference to FIG. 7, the diameters of the pillars P1 to Pn may be controlled such that, as shown in graph of FIG. 8A, the distances ① to ⑧ between the pillars P1 to Pn are gradually reduced toward the upper separation pattern USI and the dummy hole DH that are illustrated in FIG. 7. In this case, as shown in the graph of FIG. 8B, the velocity of gas may be maintained (without being reduced) as the gas approaches the upper separation pattern USI and the dummy hole DH. Consequently, the exemplary embodiment of the present disclosure may mitigate a phenomenon in which an excessive amount of impurities remain in the conductive patterns due to a reduction in velocity of the deposition gas and purge gas during the process of forming the conductive patterns.

Figure 9:
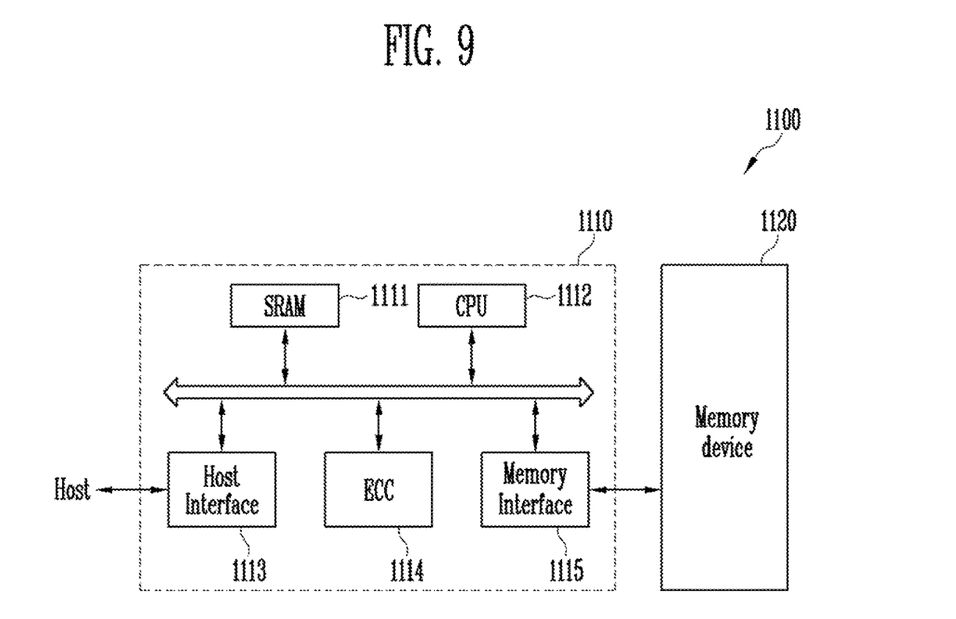
FIG. 9 is a block diagram illustrating a memory system according to an exemplary embodiment of the present disclosure.

FIG. 9 is a block diagram illustrating a memory system 1100, according to an exemplary embodiment of the present disclosure.

Referring FIG. 9, the memory system 1100 includes a memory device 1120 and a memory controller 1110.

The memory device 1120 may include a stack that is formed to surround any one structure of the pillars described with reference to FIGS. 2A, 2B and 7.

The memory device 1120 may be a multi-chip package including a plurality of flash memory chips. According to an exemplary embodiment of the present disclosure, the resistance of conductive patterns which form a chip may be reduced without the chip being increased in size. A bridge failure that may be generated between different conductive patterns may be mitigated.

The memory controller 1110 is configured to control the memory device 1120, and may include a Static Random Access Memory (SRAM) 1111, a CPU 1112, a host interface 1113, an Error Correction Code (ECC) 1114, and a memory interface 1115. The SRAM 1111 is used as an operation memory of the CPU 1112. The CPU 1112 performs general control operations for data exchange of the memory controller 1110. The host interface 1113 is provided with a data interchange protocol of a host coupled with the memory system 1100. Furthermore, the ECC 1114 detects and corrects an error included in the data that is read from the memory device 1120, and the memory interface 1115 interfaces with the memory device 1120. In addition, the memory controller 1110 may further include a Read Only Memory (ROM) or the like that stores code data for interfacing with the host.

The above-described memory system 1100 may be a memory card or a Solid State Disk (SSD) equipped with the memory device 1120 and the controller 1110. For example, when the memory system 1100 is an SSD, the memory controller 1110 may communicate with the outside (e.g., host) via one of various interface protocols, such as an Universal Serial Bus (USB), a MultiMedia Card (MMC), a Peripheral Component Interconnection-Express (PCI-E), a Serial Advanced Technology Attachment (SATA), a Parallel Advanced Technology Attachment (PATA), a Small Computer Small Interface (SCSI), an Enhanced Small Disk Interface (ESDI), or an Integrated Drive Electronics (IDE).

Figure 10:
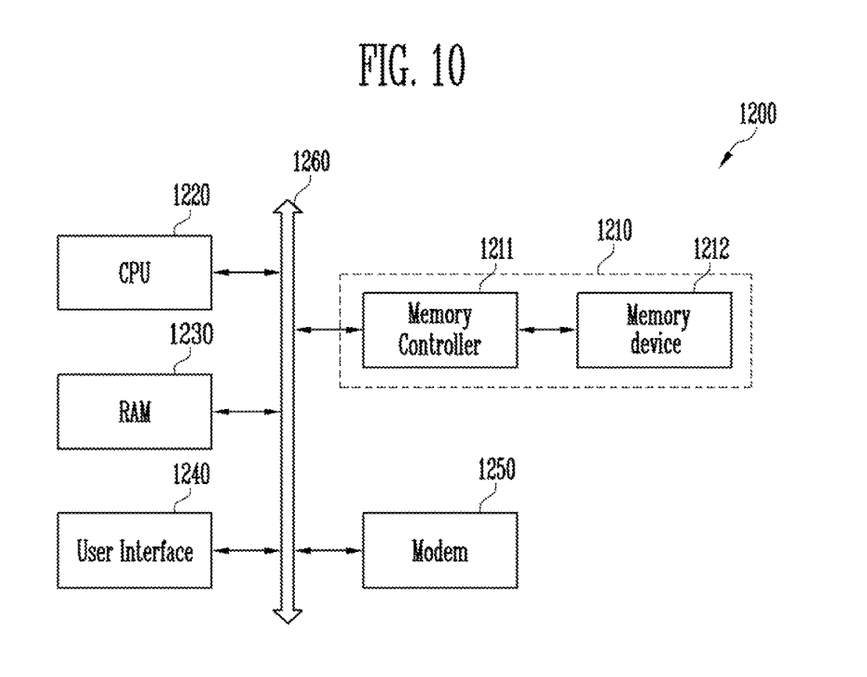
FIG. 10 is a block diagram showing a computing system including the memory system illustrated with reference to FIG. 9.

FIG. 10 is a block diagram showing a computing system 1200 including the memory system illustrated with reference to FIG. 9.

Referring to FIG. 10, the computing system 1200 may include a CPU 1220, a Random Access Memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

As described above with reference to FIG. 9, the memory system 1210 may be configured with the memory device 1212 and the memory controller 1211.

According to an exemplary embodiment of the present disclosure, the pillars passing through the stack are formed such that the sizes thereof differ from each other depending on the positions of the pillars, taking into account the velocity of gas during the manufacturing process. According to an exemplary embodiment of the present disclosure, a phenomenon in which impurities remain in conductive patterns during a process of forming the conductive patterns using gas may be mitigated. Therefore, the rate of defective semiconductor memory devices may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a first group of pillars having diameters which are gradually increased toward a first side; and
   interlayer insulating layers and conductive patterns surrounding the pillars of the first group the interlayer insulating layers and conductive patterns being alternately stacked.

2. The semiconductor memory device according to claim 1, further comprising:
   a second group of pillars having diameters which are gradually increased toward a second side,
   wherein the interlayer insulating layers and the conductive patterns also surround the pillars of the second group of pillars.

3. The semiconductor memory device according to claim 2, further comprising an upper separation pattern interposed between the first and second group of pillars.

4. The semiconductor memory device of claim 3, wherein the first and second sides are opposite.

5. The semiconductor memory device according to claim 2, wherein the pillars of the first group are arranged to be symmetrical with the pillars of the second group.

6. The semiconductor memory device according to claim 3, wherein distances between the pillars of the first group and distances between the pillars of the second group are gradually reduced toward the upper separation pattern.

7. The semiconductor memory device according to claim 3, wherein the upper separation pattern fills a trench extending in a direction and dummy holes, the dummy holes arranged to be spaced apart from each other in the extending direction of the trench and are overlapped with the trench.

8. The semiconductor memory device according to claim 7, wherein each of the dummy holes has a circular shape.

9. The semiconductor memory device according to claim 7, wherein each of the dummy holes has an elliptical shape in which a length of an axis thereof in the extending direction of the trench is greater than a length of an axis thereof in a direction intersecting with the extending direction of the trench.

10. The semiconductor memory device according to claim 7, wherein the dummy holes are spaced apart from the pillars of the first group and the pillars of the second group by distances less than distances between the pillars of the first group and distances between the pillars of the second group.

11. The semiconductor memory device according to claim 3, wherein the conductive patterns comprises:
    a first drain select line surrounding the pillars of the first group;
    a second drain select line surrounding the pillars of the second group and disposed to be spaced apart from the first drain select line by the upper separation pattern; and
    word lines extending to surround the pillars of the first group and the pillars of the second group, the word lines being stacked under the first drain select line and the second drain select line.

12. The semiconductor memory device according to claim 3, wherein the diameters of the pillars of the first and second groups are gradually increased toward the upper separation pattern.

13. A semiconductor memory device comprising:
    a stack including a first sidewall and a second sidewall that face each other in a first direction;
    an upper separation pattern disposed between the first sidewall and the second sidewall and passing through at least portion of the stack from an upper surface of the stack;
    a first row of pillars passing through the stack and disposed adjacent to the first sidewall or the second sidewall; and
    an $n_{th}$ row of pillars (n is a natural number of 2 or more) passing through the stack and disposed adjacent to the upper separation pattern, each of the pillars of the $n_{th}$ row having a diameter greater than a diameter of each of the pillars of the first row.

14. The semiconductor memory device according to claim 13, wherein the pillars of the $n_{th}$ row are spaced apart from each other by a distance less than a distance by which the pillars of the first row are spaced apart from each other.

15. The semiconductor memory device according to claim 13, wherein the upper separation pattern fills a trench extending in a second direction intersecting with the first direction and dummy holes, the dummy holes spaced apart from each other in the second direction and overlapped with the trench.

16. The semiconductor memory device according to claim 15, wherein each of the dummy holes has an elliptical shape in which a length of an axis thereof in the second direction is greater than a length of an axis thereof in the first direction.

17. The semiconductor memory device according to claim 15, wherein the dummy holes are spaced apart from the pillars of the $n_{th}$ row by a distance less than a distance between the pillars of the $n_{th}$ row.

18. The semiconductor memory device according to claim 15, wherein the stack includes interlayer insulating layers and conductive patterns that are alternately stacked,
    wherein the conductive patterns comprises:
    a first drain select line extending from the first sidewall toward the upper separation pattern;
    a second drain select line disposed on a same level as a level of the first drain select line, the second drain select line extending from the second sidewall toward the upper separation pattern; and
    word lines stacked below the first drain select line and the second drain select line, the word lines extending from the first sidewall toward the second sidewall.

19. The semiconductor memory device according to claim 18, wherein the stack further comprises liner layers formed along a surface of the conductive patterns,
    wherein the liner layers open toward the first sidewall and the second sidewall and extend on a sidewall of the upper separation pattern,
    wherein each of the liner layers comprises a barrier metal layer.

20. A semiconductor memory device comprising:
    a stack having a first sidewall and a second sidewall facing each other; and
    a plurality of pillars passing through the stack, wherein distances between the plurality of pillars are gradually reduced toward a center between the first sidewall and the second sidewall.

* * * * *